United States Patent [19]

Barszczewski

[11] Patent Number: 4,494,067
[45] Date of Patent: Jan. 15, 1985

[54] FAST FREQUENCY MEASURING SYSTEM

[75] Inventor: Andrzej Barszczewski, Gloucester, Canada

[73] Assignee: Canadian Patents & Development Limited, Ottawa, Canada

[21] Appl. No.: 425,919

[22] Filed: Sep. 28, 1982

[30] Foreign Application Priority Data

Jan. 18, 1982 [CA] Canada .................... 394,358

[51] Int. Cl.³ ........................................... G01R 23/14
[52] U.S. Cl. ........................... 324/79 D; 324/78 D; 324/78 F; 324/78 R; 324/83 D; 328/133
[58] Field of Search ............... 324/83 D, 78 D, 78 F, 324/78 R, 79 D, 79 R, 121 R, 77 E; 328/133; 318/592

[56] References Cited

U.S. PATENT DOCUMENTS

| 3,187,275 | 6/1965 | Stanley | 324/78 F |
| 3,242,435 | 3/1966 | Malnar et al. | |
| 3,260,101 | 7/1966 | Ongaro et al. | 324/78 R |
| 3,290,600 | 12/1966 | Malnar | |
| 3,502,995 | 3/1970 | Cottatellucci et al. | 324/78 R |
| 3,518,531 | 6/1970 | Huggett et al. | 324/78 R |
| 3,749,997 | 7/1973 | Cohen et al. | 318/592 |
| 4,073,432 | 2/1978 | Schröder | 324/78 D |
| 4,107,600 | 8/1978 | McMannis | |
| 4,112,358 | 9/1978 | Ashida | |
| 4,224,568 | 9/1980 | Griner | |
| 4,238,744 | 12/1980 | Iwahara | 324/77 E |
| 4,301,454 | 11/1981 | Bailey | 324/77 E |
| 4,306,297 | 12/1981 | Sugihara et al. | 328/133 |

FOREIGN PATENT DOCUMENTS 855846 11/1970 Canada .

OTHER PUBLICATIONS

Blomley and Cooding, "A S.A.W. Frequency Discriminator", 1973, IEEE Ultrasonics Symposium Procs.

Primary Examiner—Stewart J. Levy
Attorney, Agent, or Firm—Larson and Taylor

[57] ABSTRACT

Disclosed is a high resolution frequency measuring system which uses a frequency counter for a coarse reading and a frequency to voltage converter for a vernier reading, which readings are combined. Two types of converters are disclosed. One embodiment comprises an input terminal for receiving an input signal frequency and a pulse shaper for converting the input signal to a first train of pulses. The pulses are applied to a delay means to produce a second train of pulses delayed with respect to the first train of pulses and the first and second trains of pulses are applied to first and second inputs of a phase detector, e.g. a flip-flop. In another embodiment, delayed and undelayed versions of the input signal are fed to separate pulse shapers and then to the inputs of the phase detector. The phase detector has an output connected to operate a switch between two voltage levels to produce a third train of pulses having a duty ratio depending on the phase difference between the first and second trains of pulses. The third train of pulses is time averaged to produce an output voltage, the output voltage being proportional to the phase difference between the first and second trains of pulses and varying with changes in the frequency of the input signal. An analog to digital converter converts the output voltage to a digital reading for combining with the output of the frequency counter. The invention provides a unique, fast frequency measuring system allowing high resolution, not obtainable with a counter.

10 Claims, 7 Drawing Figures 4,494,067

FAST FREQUENCY MEASURING SYSTEM

BACKGROUND OF THE INVENTION

This invention relates to frequency measuring systems.

U.S. Pat. No. 4,112,358 of Ashida, issued Sept. 5, 1978, discloses a frequency measuring device involving the principle of period measurement with a counter and a vernier correction, where the vernier measures a fraction of one clock period. An integrating voltmeter reads fraction of period converted into said frequency resolution.

The counter-vernier principle will operate very well on stable frequencies with low phase noise but, in the case of phase noise, the periods of the first and last cycles which are used to compute the "vernier", or frequency correction, will be unstable.

In the present invention the "vernier" quantity is averaged by an analog low pass filter, the frequency characteristics of which may be selected as required, e.g. to reject interfering frequencies. A system according to the invention will produce a stable reading even with input signals affected by high phase noise.

A variation of the prior art counter-vernier principle, adopted for low frequency operation, is disclosed by U.S. Pat. No. 4,224,568 of Griner, issued Sept. 23, 1980. The system of that patent takes the sum of the full signals counted plus the fractional signal at the beginning of the sampling period and the fractional signal at the end of the sampling period to provide an approximation of the actual frequency being measured.

U.S. Pat. No. 4,107,600 of McMannis, issued Aug. 15, 1978, discloses a system based on period measurement which is converted into frequency. The system is applicable only to stable frequencies. An "adaptive" part is used to maintain constant resolution for low frequency measurements.

SUMMARY OF THE INVENTION

A frequency measurement system in accordance with the present invention operates by combining the readings of a conventional frequency counter with a short gate time, and the digitized output of an analog processor of near infinite resolution. The invention provides a unique, fast frequency measuring system allowing high resolution in the presence of high phase noise, not obtainable with a counter timer. The system is a hybrid system in which coarse frequency measurement is done with a conventional digital counter and fine (vernier) frequency measurement is achieved with an analog processor, the output of which is digitized and combined with the data from the counter. The "combining" is performed by a digital processor, e.g. a microprocessor.

According to a broad aspect of the invention there is provided a frequency measuring system comprising a frequency counter for producing a coarse digital reading of an input signal frequency, means for producing a digital vernier reading of said input signal frequency, and means for combining the coarse reading and vernier reading to produce a final frequency reading, said means for producing a digital vernier reading comprising a frequency to voltage converter having an input terminal for receiving said input signal frequency, and means for converting said input signal to first and second trains of pulses, said second train of pulses being delayed with respect to said first train of pulses, said first and second trains of pulses being applied to first and second inputs of a phase detector, said phase detector having an output voltage proportional to the phase difference between said first and second trains of pulses and varying with changes in the frequency of the input signal, said converter further comprising analog means for producing an average of said output voltage and an analog to digital converter for converting said average of said output voltage to a digital reading.

The phase detector produces an output voltage which is proportional to the phase difference between the first and second trains of pulses. In the preferred embodiments described hereinafter a flip-flop is used as the phase detector with the first and second trains of pulses applied to its set and reset inputs. The flip-flop then produces output pulses having a width proportional to the phase difference between the first and second trains of pulses.

One system constructed according to the invention allowed measurement of frequency from about 100,000 Hz to 200,000 Hz to an accuracy better than 0.1 Hz in 0.01 sec. It will be appreciated that counter accuracy is ±1 count and with a 0.01 second gate time its contents will display frequency to ±100 Hz. Thus measurement in 0.01 sec. to an accuracy of ±0.1 Hz, as achieved by the present invention, represents a 1000 fold improvement over frequency measurement with a counter.

The analog processor referred to above is an analog frequency to voltage converter. In one embodiment of the converter, an input frequency to be measured is converted by a pulse shaper into a train of short pulses which are fed directly and, via a delay line, to set and reset a flip-flop operating as a conventional phase detector with a duty ratio directly proportional to the phase between the two trains of pulses.

In an alternative embodiment of the converter, the input frequency is fed directly to one pulse shaper and via a delay line to a second pulse shaper. The outputs of the two pulse shapers are then fed to the set and reset inputs of a flip-flop. To produce a $2\pi$ phase shift, the input frequency has to change $\Delta F = 1/\text{delay}$. It follows that the output will repeat every multiple of $\Delta F$.

The output of the flip-flop, in either embodiment, operates a precision switch, which switches between two voltage reference levels, $V_R$ and ground. The output of the switch is filtered with a low pass filter, with output $$V_O = V_R \frac{t_{on}}{t_{on} + t_{off}}.$$

BRIEF DESCRIPTION OF THE DRAWING

The invention will now be described in more detail in conjunction with the accompanying drawings, in which.

DESCRIPTION OF THE PREFERRED EMBODIMENTS

Figure 1:
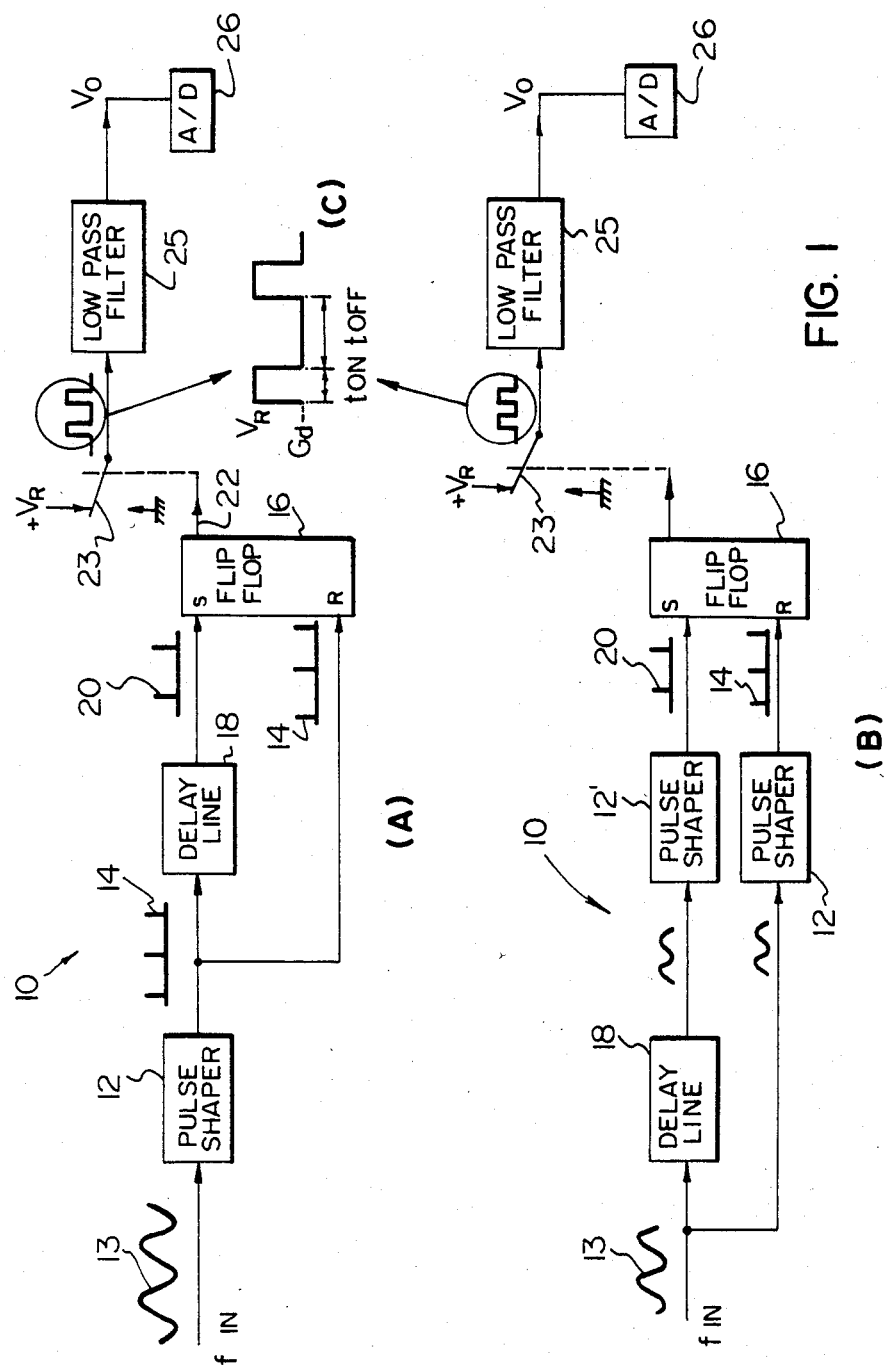
FIG. 1(A) is a block diagram of a first embodiment of a frequency to voltage converter which may be used in a system according to the present invention.
FIG. 1(B) is a block diagram of a second embodiment of a frequency to voltage converter which may be used in this invention.
FIG. 1(C) is an enlarged drawing of the input waveform to the low pass filter in FIG. 1(A) or 1(B)

Referring to FIG. 1(A), one embodiment of a frequency to voltage converter which may be used in a system according to the invention is generally indicated at 10. An input frequency $f_{in}$ to be measured is applied to a pulse shaper 12 which converts the input waveform 13, illustrated as sinusoid, into a train of short pulses 14. The pulses may correspond to, say, positive zero crossings. Pulse shapers are, of course, well known in the art and need not be described in detail.

The pulses 14 are applied to the reset (R) input of a flip-flop 16 and to the input of a delay line 18 which produces at its output a train of pulses 20 which are delayed with respect to the pulses 14. The delayed pulses 20 are applied to the set (S) input of flip-flop 16. The delayed and nondelayed pulses alternately set and reset the flip-flop 16 which operates as a conventional phase detector having a duty ratio directly proportional to the phase between the two trains of pulses 14 and 20.

FIG. 1(B) illustrates an alternative embodiment of a frequency to voltage converter which may be used in a system according to the invention. In this embodiment it is again assumed that the input signal $f_{in}$ is a generally sinusoidal waveform 13. The waveform 13 is applied directly to a pulse shaper 12 and, via a delay line 18, to a second pulse shaper 12'. Pulse shaper 12 produces at its output a train of short pulses 14 and pulse shaper 12' produces at its output a train of pulses 20 which are delayed with respect to the pulses 14, just as in the FIG. 1(A) embodiment. The remainder of the circuit shown in FIG. 1(B) operates in the same manner as that of FIG. 1(A).

In the circuit of FIG. 1(A) the delay line 18 has to pass pulses and must therefore have a wide bandwidth. In the circuit of FIG. 1(B), the pulses are not produced until after the signal passes through the delay line 18; therefore delay line 18 need not have as wide a bandwidth as in the FIG. 1(A) embodiment.

To produce a $2\pi$ phase shift, with either embodiment, the input frequency has to change by $\Delta F$ equal to 1/delay. It follows that the output will repeat every multiple of $\Delta F$.

The output 22 of the flip-flop 16 operates a precision switch 23, which switches between two reference levels shown as $V_R$ and ground. The square wave output of the switch 23, shown enlarged in FIG. 1(C) is filtered with a low pass filter 25, with output $$V_O = V_R \frac{t_{on}}{t_{on} + t_{off}}.$$

Figure 3:
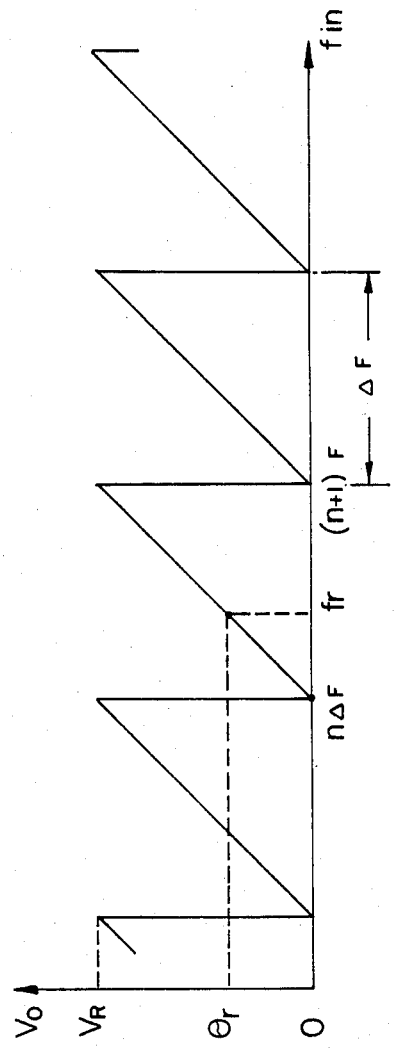
FIG. 3 is a diagram of output voltage vs. input frequency for the arrangement of FIG. 1(A) or 1(B)

The output voltage $V_o$ vs. frequency $f_{in}$ is shown in FIG. 3. As can be seen, any particular value of $V_o$ repeats for every change $\Delta F$ of the input frequency $f_{in}$.

The output $V_o$ of the frequency to voltage converter can be digitized by an A/D converter 26 and combined with the readings of a conventional frequency counter having a short gate time to provide a digital value of the input frequency $f_{in}$.

The frequency to voltage converter has substantially infinite resolution, limited only by the system noise which is less than the resolution of the analog to digital converter 26. The low pass filter 25 is essentially an anti-aliasing filter, often used to process input data as required, e.g. to remove unwanted interference of known frequency characteristics such as 60 Hz "hum".

The system is calibrated, preferably periodically, with a known and accurate frequency $f_R$ to which corresponds an output voltage $\theta_R$ from the output of low pass filter 25 (see FIG. 3).

The ramp number n for the frequency $f_R$ is determined experimentally by an independent measurement of $\Delta F$ and is thus known a priori. An accurate frequency source (such as a frequency synthesizer) is connected to the fast frequency measuring system. The frequency is adjusted until, say, ramp 1 reads 0 volts, then the frequency is increased until a subsequent reading of 0 volts is obtained. The difference between consecutive frequencies producing a 0 volts reading gives an approximate value $\Delta F$.

The equation $$f_R = (n + \theta_R)\Delta F$$

is used to calculate $\Delta F$ with a greater accuracy. In this equation $\theta_R$ is a fraction of $V_R$ and thus of $\Delta F$.

This calibration can be made periodically to compensate for possible drifts, which could be caused, for example, by delay variations in the delay line with temperature. Similarly, an unknown frequency $f_x$ is determined by the relation $$f_x = (K + \theta_x)\Delta F$$

K is an integer, a number of which $\Delta F$'s determined by a frequency counter.

As an example, a prototype was constructed where $\Delta F = 996$ Hz, 100,000 Hz $\leq f_x \leq$ 200,000 Hz, counter gate time 0.01 sec. and with a 17 bit A/D converter. The frequency resolution was $1000/2^{17} \simeq 0.0076$ Hz and k was the number of thousands of Hz in the frequency counter. With a gate time of 0.01 sec. the counter measured the frequency $f_{in}$ to $\pm 100$ Hz. Combining the two results provided a measurement of frequency averaged over approximately 0.01 sec. with 0.01 Hz resolution; this is equivalent to a measurement of the frequency multiplied by 10,000, which is quite impossible with large phase noise and with the input frequency varying over a wide range. Furthermore, there is a fundamental difference in this process from that of frequency multiplication and counting. When frequency varies with time, periodic counting of the frequency over a time interval is equivalent to averaging over this interval, a process essentially of sampling which is subject to aliasing errors.

It can be shown that the frequency response of such a prior art measuring system is $$A(f) = \left| \frac{\sin \pi fT}{\pi fT} \right|$$

where T is the averaging period, giving an approximate "bandwidth" of 1/T. If the input is frequency modulated with modulation frequency $f_m$ which is sampled and averaged at frequency $f_s$ then frequency products result having the form $\pm kf_s \pm lf_m$ where k and l are integers. The frequency products which fall within the bandwidth will appear as errors.

In the present invention involving conversion of the frequency to voltage and linear (analog) filtering it is possible to remove unwanted frequency components and to eliminate aliasing before the A/D converter. Furthermore, there is considerable freedom in the design of the low pass filter to suit requirements. Typically, 3rd or 4th order filters are used. Note that sin $\pi fT/\pi fT$ has $1/\pi fT$ asymptote and approximates the characteristics of a first order low pass filter.

It follows that the proposed system offers significant advantages over the direct frequency multiplication and counting method of frequency measurement.

Figure 2:
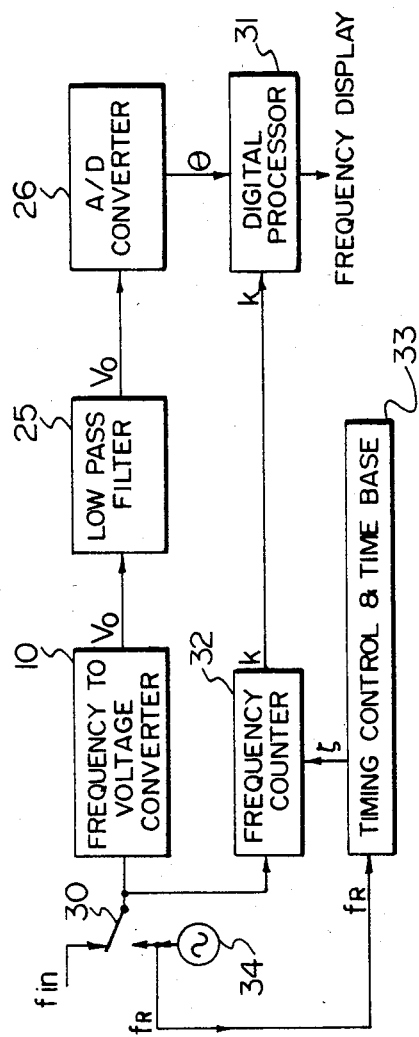
FIG. 2 is a block diagram of a simplified frequency measuring system according to the invention.

FIG. 2 is a block diagram of a frequency measuring system according to the invention. A frequency $f_{in}$ to be measured is applied via switch 30, in the position shown, to the input of a frequency to voltage converter 10 of either type discussed above in connection with FIGS. 1(A) and 1(B). Converter 10 provides an output voltage $V_o$ which is filtered by low pass filter 25, digitized by A/D converter 26, and fed to a digital processor 31 as a value $\theta$.

The frequency $f_{in}$ is also applied to a frequency counter 32 which determines the value of k, e.g. thousands of Hz, which value k is supplied to the digital processor 31.

The digital processor 31, which may be a microprocessor, combines the values k and $\theta$ (coarse and vernier values) to produce a digital output value of $f_{in}$ which may be applied to a visual frequency display, not shown.

The frequency counter 32 is controlled by a timing control and time base circuit 33 which is supplied with a stable reference frequency $f_R$ from a source 34.

As discussed above, the system may be calibrated by moving switch 30 to its alternate position in which $f_R$ is fed to the frequency to voltage converter 10. This may be done automatically at periodic intervals.

Obviously the input signal $f_{in}$ may be any of a wide variety of signals of which it is desired to know the frequency. As an example, the system may be used to conduct measurements of the earth's magnetic field by means of an optically pumped cesium-vapor magnetometer mounted in an aircraft. The output of the cesium-vapor magnetometer is a frequency proportional to the magnetic field, known as Larmor frequency, $f_L = \alpha \phi_M$ where $F_L$ is the Larmor frequency, $\alpha \approx 3.5$ H/$\gamma$ and $\phi_M$ is the magnetic field in gammas ($\gamma$) (1 Gauss = 100,000$\gamma$). As the aircraft flies the magnetic field changes. The changes, usually small, are induced by geology and aircraft manoeuvres. These are all slow changes in the 0 to 1.0 Hz range. Also, there are field changes caused by electrical interferences which usually are of a considerably higher frequency. For earth's magnetic field, the frequency range of the Larmor frequency is approximately 100 KHz to 200 KHz. A low pass filter can be optimized for this particular task.

Figure 4:
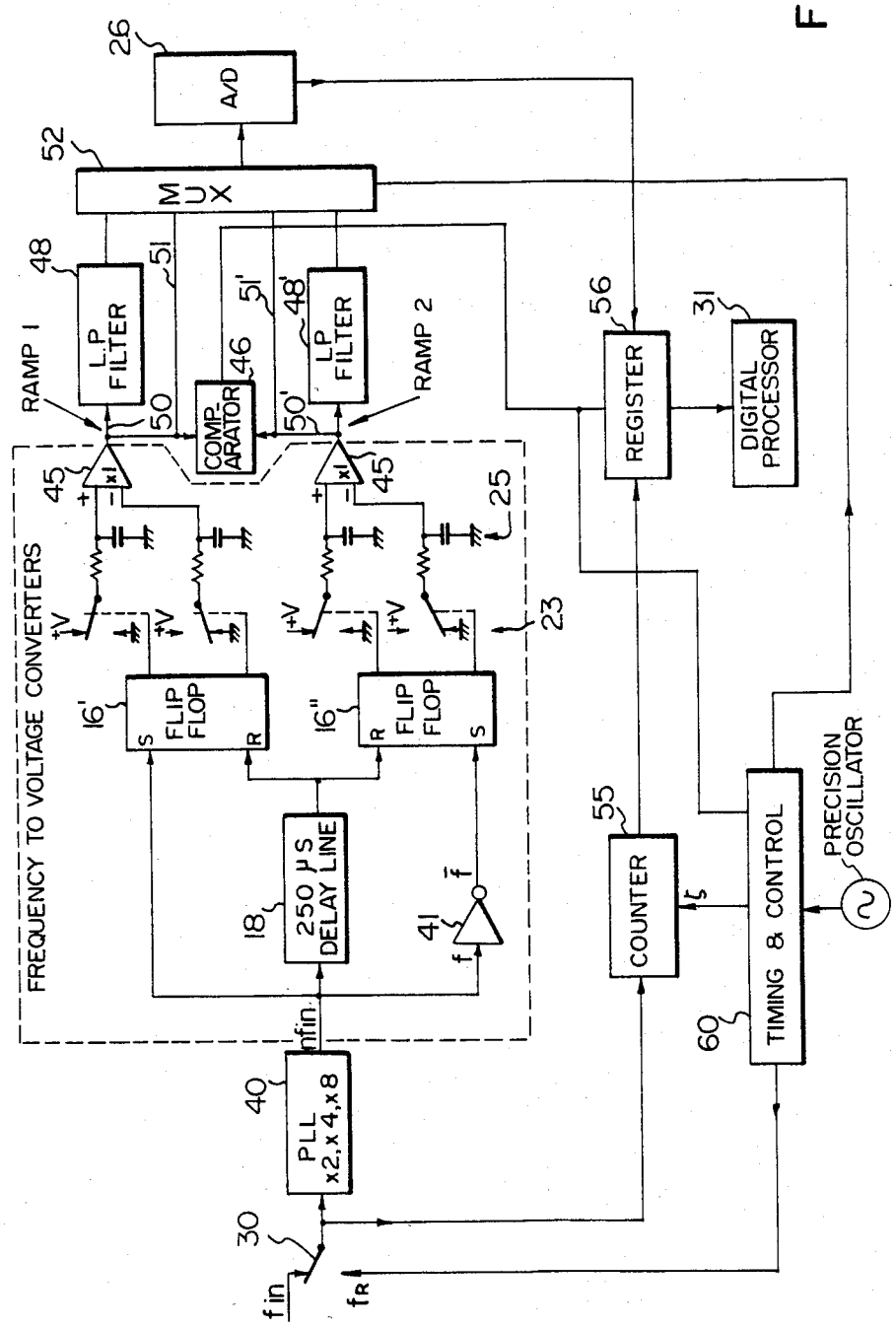
FIG. 4 is a block diagram of a frequency measuring system which may be used for measuring the earth's magnetic field, and FIG. 5 comprises waveforms useful in explaining the operation of an embodiment of the invention.

A block diagram of the system for measuring the earth's magnetic field is shown in FIG. 4. In order to achieve high resolution of $\gamma$, the Larmor frequency, which is $f_{in}$, is multiplied by a phase locked loop (PLL) 40. The multiplication of frequency by the PLL is equivalent to a multiplication of the delay time in the delay line 18; e.g. a 250 $\mu$s delay line gives a $\Delta F=4000$ Hz but if a multiplication factor of 4 is used the value of $\Delta F$ is reduced to 1000 Hz. Selecting a multiplication factor allows adoption of a $\Delta F$ range to suit a given requirement.

The phase locked loop 40 may be constructed to give various multiplication factors, e.g. 1,2,4, and 8. Phase locked loops are well known in the art and hence need not be described in detail.

Figure 5:
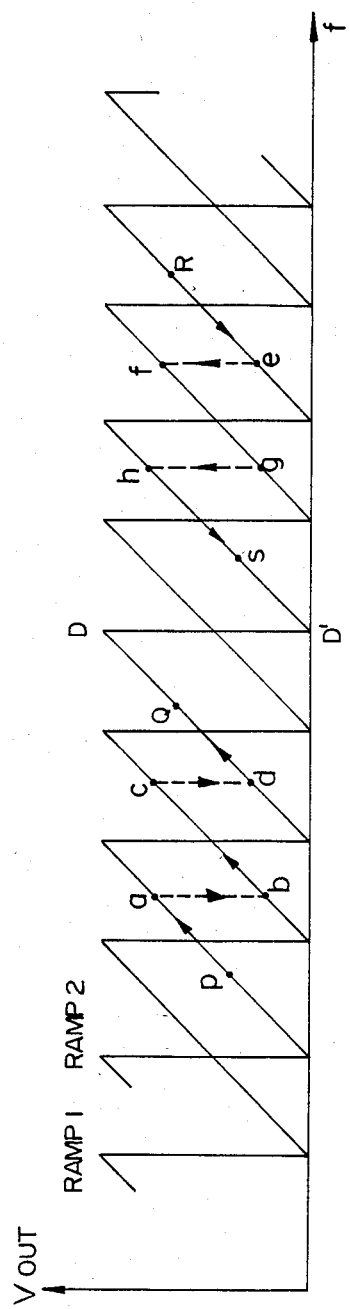

The system of FIG. 4, which is based on the FIG. 1(A) embodiment, differs from that of FIG. 2 in that two frequency to voltage converters are used to provide two ramps, one displaced by 0.5$\Delta F$ with respect to the other. A comparator selects the "preferred" ramp which is less likely to change, namely the ramp with, for example, output between 0.25 to 0.75 of full scale. In this manner it is possible to avoid problems due to filter settling time which would occur when the output abruptly changes at the boundary of a ramp (FIG. 5, line DD').

The output of PLL 40, a symmetric square wave, is fed directly to the set (S) input of a first flip-flop 16', to the input of delay line 18 and to the input of inverter 41. The inverter input is applied to the set (S) input of flip-flop 16". Thus the "set" inputs of flip-flops 16' and 16" are 180° out of phase which will make their outputs differ by half a period.

The output of PLL 40 feeds a delay line 18 which feeds the reset (R) inputs of both flip-flops 16' and 16". For this particular application, where $f_{in}$ is approximately 100 KHz to 200 KHz, the delay line 18 may be a glass delay line with a delay of 250 $\mu$s.

In this embodiment, the flip-flops have complementary outputs operating switches, generally indicated at 23, operating between ground and $+V$ reference voltage. The outputs of the switches are filtered with low pass filters, generally indicated at 25, and subtracted from each other with precision operational amplifiers 45, 45'.

The precision switches 23 are preferably solid state switches e.g. RCA, CD-4050BE.

The comparator 46 selects the preferred ramp which is not likely to change at this instant, that is the ramp with output between 0.25 to 0.75 of full scale.

This is illustrated in FIG. 5; when frequency is increased from point P to point Q, a path such as PabdcQ will be followed. Similarly, for a frequency decreasing from R to S, the path will be RefghS. The frequency can be measured on either of two ramps selected by the comparator. For ramp one the measured frequency will be $$f_x = (K + \theta_x)\Delta F$$

for ramp two $f_y = (K + \frac{1}{2} + \theta_y)\Delta F$. The 0.5 $\Delta F$ is added (or subtracted) since the two ramps are displaced by 0.5$\Delta F$. A binary digit (0 or 1) indicating ramp selection is forwarded to the computer by the comparator 46.

When a ramp goes through a discontinuity such as illustrated on FIG. 5 as DD' on ramp 2 a step voltage is applied to the low pass filter 48. The time necessary to recover for the low pass filter introduces limitations on frequency slewing rate with which the instrument will provide an accurate reading.

The output of the comparator 46 (0 or 1) is fed to the timing and control circuit 60 which then causes the multiplexer 52 to select ramp 1 or ramp 2. At the same time, the output of comparator 46 is fed to register 56 to inform the digital processor 31 whether to add 0.5$\Delta F$.

For the airborne magnetometer application, two low pass, third order (modified Shumard) filters 48 and 48' are used with a cut off frequency of 1.6 Hz. The outputs 50 and 50' (Ramp 1 and Ramp 2) are fed to a multiplexer 52, as are the outputs 51 and 51' of low pass filters 48 and 48'. The multiplexer 52 samples the outputs at a rate of 8 samples per second. The comparator 46 causes the multiplexer 52 to select either output 50 or output 50' depending on the output (ramp selection). Periodically, e.g. every 64 seconds, a calibration frequency $f_R$ is applied to the system input by timing and control circuit 60 changing switch 30 to its alternate position. At this time the multiplexer 52 selects output 51 or 51', i.e. the filter 48 (or 48') is disconnected and bypassed. Each ramp is alternately calibrated. It is necessary to disconnect and bypass the low pass filters 48,48' because the filter settling time for a step input (calibration, $\theta_R$) would be excessive. From calibration data small corrections are computed which are used to enhance the accuracy of measurements.

The frequency is also measured with a digital counter 55 with 0.1 sec gate time to determine the average frequency to $\pm 10$ Hz ($\pm 1$ count $\pm 10$ Hz). The output of the counter 55, output of A/D converter 26 and ramp selection binary digit are loaded into the storage register 56 and transferred to the digital processor 31. Although not shown in FIG. 4, the digital processor 31 is also supplied with data indicating calibration, which ramp is digitized and end of conversion. The digital processor may be an Interdata 732.

An example has been given above of measuring magnetic fields but the system according to the invention could find use in many other applications, such as:

(1) Readout of transducers having an output frequency varying as a function of a physical variable and subject to high phase noise (e.g. magnetic field, force, pressure, etc.), or transducers operating on the Doppler principle.
(2) Process control where fast and accurate frequency readout is essential, e.g. in a feedback loop where excessive delay would result in loop instability.
(3) Frequency meters or more specifically frequency to digital converters, with readout approximating "time" average of signals contaminated with high phase noise.
(4) Cleaning up signals in an f.m. telemetry system.
(5) Measuring carrier frequency in a narrow band f.m. communication system.
(6) Frequency filter. Using frequency to digital and digital to frequency apparatus, an input frequency contaminated with spurious f.m. can be cleaned up. A larger interference rejection can be obtained than with a phase locked loop.

A few comments on possible frequency range are in order. A high frequency range can always be heterodyned to a lower one or down-converted so there is virtually no high frequency limit of utilization of the present invention. The lower frequency limit is determined by filtering in the frequency to voltage converter and is estimated to be of the order of 200 Hz.

The frequency resolution is directly related to the frequency span $\Delta f$ in the frequency to voltage converter. The resolution is 15 p.p.m. of the span with a 17 bit A/D converter and the accuracy approaches 100 p.p.m. or 0.01%. Precision glass delay lines of 4 ms delay exist, which would produce 250 Hz frequency span $\Delta f = 1/\text{delay}$. With a frequency multiplication by a phase locked loop (PLL) by, say, a factor of 10, an effective $\Delta f$ of 25 Hz would be achieved. This would correspond to 0.0025 Hz accuracy and 0.000375 Hz resolution. The minimum gate time would be 1/25 sec or 40 ms, but since some time overlap is desirable a 100 ms gate time would be more realistic. Theoretically the resolution and accuracy depend on delay in the delay line and the frequency multiplication factor.

What is claimed is:

1. A frequency measuring system comprising a frequency counter for producing a coarse digital reading of an input signal frequency, means for producing a digital vernier reading of said input signal frequency, and means for combining the coarse reading and vernier reading to produce a final frequency reading, said means for producing a digital vernier reading comprising a frequency to voltage converter having an input terminal for receiving said input signal frequency, and means for converting said input signal to first and second trains of pulses, said second train of pulses being delayed with respect to said first train of pulses, said first and second trains of pulses being applied to first and second inputs of a phase detector, said phase detector having an output voltage proportional to the phase difference between said first and second trains of pulses and varying with changes in the frequency of the input signal, said system further comprising analog means for producing a time average of said output voltage and an analog to digital converter for converting said time average of said output voltage to a digital reading, wherein said converter has an output which repeats every $\Delta F$ of the frequency of the input signal, said system comprising a further frequency to voltage converter for producing a second output displaced by a constant fraction of $\Delta F$ with respect to the output of the first converter, and means for switching from one output to the other to avoid discontinuities occurring every $\Delta F$ in each output.

2. A system as claimed in claim 1 wherein the output voltage of said phase detector operates a switch means between two voltage levels to produce a third train of pulses having a duty ratio depending on the phase difference between the first and second trains of pulses.

3. A system as claimed in claim 2 wherein said phase detector is a flip-flop.

4. A system as claimed in claim 3 wherein said means for converting said input signal to first and second trains of pulses comprises a pulse shaper having an input to receive said input signal and an output at which appears said first train of pulses, said first train of pulses being fed through a delay line to produce said second train of pulses.

5. A system as claimed in claim 3 wherein said means for converting said input signal to first and second trains of pulses comprises a first pulse shaper adapted to receive said input signal and provide as an output said first train of pulses, a delay line adapted to also receive said input signal and providing a delayed output signal to a second pulse shaper, said second pulse shaper having an output at which appears said second train of pulses.

6. A system as claimed in claim 1, 2 or 3 wherein said means for producing a time average of said output voltage is a lowpass filter.

7. A system as claimed in claim 1, wherein said constant fraction is of the order of 0.5.

8. A system as claimed in claim 4, 5 or 7 wherein said means for producing a time average of said output voltage is a lowpass filter.

9. A system as claimed in claim 1, 2, 3 or 7 wherein said means for combining the outputs comprises a digital processor.

10. A system as claimed in claim 1, 2, 3 or 7 and further comprising means for periodic calibration including means for applying to the input a signal of known frequency.

* * * * *